United States Patent
Hirose et al.

(10) Patent No.: US 6,217,650 B1
(45) Date of Patent: Apr. 17, 2001

(54) EPITAXIAL-WAFER FABRICATING PROCESS

(75) Inventors: Takeshi Hirose; Hiroyuki Kawahara; Takeo Tamura, all of Nagasaki; Masayoshi Danbata, Kanagawa, all of (JP)

(73) Assignee: Komatsu Electronic Metals Co., Ltd., Kanagawa (JP)

( * ) Notice: Subject to any disclaimer, the term of this patent is extended or adjusted under 35 U.S.C. 154(b) by 0 days.

(21) Appl. No.: 09/334,118

(22) Filed: Jun. 15, 1999

(30) Foreign Application Priority Data

Jun. 16, 1998 (JP) .................................... 10-183286

(51) Int. Cl.⁷ .................................... C30B 25/02
(52) U.S. Cl. ................. 117/84; 117/2; 117/3; 117/9; 117/902
(58) Field of Search .................... 117/2, 3, 9, 84, 117/902

(56) References Cited

U.S. PATENT DOCUMENTS

| 2,615,903 | 10/1952 | Hunter et al. | 260/397.1 |
| 2,652,344 | 9/1953 | Simms | 106/307 |
| 5,148,604 | * 9/1992 | Bantien | 33/366 |

FOREIGN PATENT DOCUMENTS

| 08264780 | * 10/1996 | (JP) . | |
| 9-63956 | 3/1997 | (JP) | H01L/21/20 |
| 9-139027 | 5/1997 | (JP) | G11B/20/18 |
| 9-194296 | 7/1997 | (JP) | C30B/29/06 |
| 9-266186 | 10/1997 | (JP) | H01L/21/304 |

* cited by examiner

Primary Examiner—Felisa Hiteshew
(74) Attorney, Agent, or Firm—Sheridan Ross P.C.

(57) ABSTRACT

In an epitaxial-wafer fabricating process for epitaxially growing a silicon layer on the surface of a silicon wafer having the crystal orientation <100> or <111> and an inclination angle of $0°\pm1°$ in a reactive gas at a atmosphereicpressure, a growth temperature T is lower than a normal growth temperature by 50° C. to 100° C. during the process of epitaxial growth.

12 Claims, 3 Drawing Sheets

EPITAXIAL-WAFER FABRICATING PROCESS

BACKGROUND OF THE INVENTION

1. Field of the Invention

The present invention relates to a process of fabricating epitaxial wafers, and more particularly to a process of fabricating epitaxial wafers of a small haze level.

2. Description of the Related Art

There is known a process of fabricating epitaxial wafers in a manner that an epitaxial layer of monocrystalline silicon is formed on the mirror-polished surface of a silicon wafer by an epitaxial growth process.

Current integrated semiconductor devices increase their integration densities at remarkable speeds. In this circumstance, semiconductor designers are consistently put under strong pressure of device performance improvements, such as reduction of power dissipation and increase of operating speed. In this connection, further improvement of the flatness of the epitaxial wafer and reduction of particles of 0.1 μm are essential to the integrated semiconductor devices of 0.18 μm or smaller design rule. To this end, it is necessary to suppress the growth of the surface roughness of the wafer, which is caused in the epitaxial growth process. The lowering of a haze level on the epitaxial wafer is required for detecting fine particles of 0.1 μm or smaller on the epitaxial wafer. The haze is due to scattering of light reflected on the wafer surface, and appears as a noise component in an output signal of an optical particle counter. Increase of the haze level indicates increase of the surface roughness of the epitaxial wafer. The haze is light scattering on the wafer surface, and appears as a noise component in an output signal of an optical particle counter when particles above the wafer surface is measured by the particle counter. Therefore, a degree of the surface roughness of the epitaxial layer formed on the silicon wafer is likely to increase with increasing the haze level. Further high haze level makes it difficult to detect fine particles of 0.1 μm or smaller. Reduction of the haze level on the epitaxial wafer is essential to the highly integrated semiconductor devices.

There are many proposals of epitaxial wafer fabricating processes to lower the haze level. JP-A-9-63956 is a typical example of those proposals. The publication shows low pressure epitaxial growth technique in low temperature conditions to lower the haze level. More precisely, a silicon wafer, mirror polished, is put in a reaction furnace, and an anneal gas of hydrogen ($H_2$) is injected into the reaction furnace till a predetermined pressure of the injected gas therewithin is reached. The reaction furnace is maintained at an anneal temperature for predetermined period of time, whereby an annealing process is performed within the reaction furnace. The hydrogen is discharged from the reaction furnace to set up a vacuum therein. A reactive gas containing hydrogen and dichlorosilane ($SiH_2Cl_2$) is supplied into the vacuum reaction furnace till a pressure of the injected gas therewithin is approximately 13.3 kPa. The reaction furnace is maintained at a growth temperature T (=900° C. or lower) for a predetermined period of time; a thin monocrystalline silicon layer is expitaxially formed on the surface of the epitaxial wafer.

The silicon wafer fabricating process disclosed in the Japanese publication mentioned above has the following problems.

The epitaxial growth process is categorized into a low-pressure epitaxial growth process and an atmospheric pressure epitaxial growth process. In the former process, the reaction gas is set at a low pressure of about 13.3 kPa. In the latter process, the reaction gas is set at a atmospheric pressure. The low-pressure epitaxial growth process is superior to the atmospheric pressure epitaxial growth process in that the thickness and a resistivity of the epitaxial layer is controllable with higher precision. The former is inferior to the latter in that a growth rate of the expitaxial layer is slower and hence, and hence the wafer production efficiency is unsatisfactory. The low-pressure epitaxial growth process has additional disadvantages. When a dopant is boron or phosphorus, its auto-doping quantity is likely to increase. Additional equipment, such as a vacuum pump, are required since the vacuuming of the reaction furnace is essential. This results in complexity of the wafer fabricating equipment and increase of cost to manufacture.

As described above, in the publication wafer fabricating technique, the epitaxial growth process is performed at about 13. 3 kPa (10. 6 kPa in the embodiment), and hence the productivity is low. Also when the atmospheric pressure epitaxial growth process is used to improve the productivity in producing the epitaxial wafers, the requirement of the haze level reduction exists also the normal-pressure process is used for improving the productivity in producing epitaxial wafers. However, the haze-level reduction technique employed is not matured yet in the atmosphereic pressure epitaxial growth process.

Fine particles generated within the fabricating equipment, and dust particles generated in handling the epitaxial wafers attach to the surface of the epitaxial wafer. Accordingly, surface defects inevitably occur in the epitaxial wafers. Those fine particles and the surface defects are detected by use of a particle counter. The particles as well as the haze level deteriorate the quality of the semiconductor device. The necessity is that the number of particles of 100 nm or smaller (particle diameter) present on the epitaxial wafer should be smaller than a predetermined number of particles, and that the future semiconductor products should be guaranteed on the number of such fine particles. To the guarantee, it is necessary to measure the number of the particles present on the epitaxial wafer. The optical particle counter, usually used, cannot detect particles of 100 nm or smaller in particle diameter since optical signals representative of light reflected by such fine particles sink into the noise of the particle counter, viz., optical signals caused by the haze on the epitaxial wafer.

Therefore as the haze level is higher, an accurate measurement by the particle counter is more difficult. This tendency makes it difficult to guarantee the number of fine particles and hence the product quality of the produces epitaxial wafers.

On the other hand, atmospheric-pressure epitaxial growth process can grow the epitaxial layer at high rate, but the epitaxial layer formed is susceptible to a thermal stress and poor in quality.

SUMMARY OF THE INVENTION

Accordingly, an object of the present invention is to provide a process of fabricating epitaxial wafers which fabricates epitaxial wafers giving rise to haze low in level by use of the atmospheric-pressure epitaxial growth process.

Another object of the present invention is to provide a process of fabricating epitaxial wafers which forms Si epitaxial layer of good quality by lessening a thermal stress of the layer.

According to an aspect of the present invention, there is provided a first epitaxial-wafer fabricating process for epitaxially growing a silicon layer on the surface of a silicon wafer having the crystal orientation <100> or <111> and an inclination angle of 0°±1° in a reactive gas at an atmospheric pressure, wherein a growth temperature T is lower than a normal temperature by 50° C. to 100° C. during the process of epitaxial growth.

The inventor(s) found the following fact: A silicon wafer of <100> in crystal orientation and 0°±1° in an inclination angle exhibits a minimum haze level if a growth temperature T is lower than a normal temperature by 50° C. to 100° C. during the process of epitaxial growth (in the case of a dichlorosilane gas as a source gas, the growth temperature is 950° C. to 1050° C.). The invention was based on this discovery. If so selected, the haze level on the surface of the fabricated epitaxial wafer is lowered. This leads to reduction of an S/N of an output signal of a particle counter when it measures a haze level of the fabricated epitaxial wafer, viz., improvement of a measuring accuracy of the particle counter. Thus, if epitaxial layers are formed by use of an epitaxial growth furnace, which is used for epitaxially forming epitaxial wafers as products, the haze level on the products is reduced, and the particle counter can accurately detect the number of particles. This fact indicates realization of the practical evaluation on the epitaxial wafer surface and process environments. The number of particles on the evaluationSi epitaxial layer, thus measured, may be used for evaluating a degree of clarity in the process environment or the epitaxial growth process and hence, the epitaxial wafers manufactured by use of the epitaxial growth furnace. The result is to guarantee the measurement of the numbers of particles on the epitaxial wafers manufactured in the epitaxial growth furnace and hence, the product quality of the wafers.

The source gases and optimum growth temperatures for haze reduction may relatively be tabulated in the following table.

TABLE 1

| Source gas | Optimum growth temperature |
| --- | --- |
| $SiH_4$ | 850–940° C. |
| $SiH_2Cl_2$ | 900–1000° C. |
| $SiHCl_3$ | 950–1050° C. |
| $SiCl_4$ | 1050–1150° C. |

In the first epitaxial-wafer fabricating process, an annealing process may be performed at a temperature within a range from an anneal temperature to a melting point of the silicon wafer before the epitaxial growth process.

As just mentioned, before the epitaxial growth process, an annealing process is performed at a temperature within a range from an anneal temperature to a melting point of the silicon wafer before the epitaxial growth process. When the annealing process is performed at 950° C. or higher (but below the melting point of the epitaxial wafer), the epitaxial layer is not polycrystallized but polycrystallized. This leads to improvement of the productivity. Further, the epitaxial wafer is not molten since the anneal temperature is not increased above the melting point of the epitaxial wafer.

According to another aspect of the invention, there is provided a second epitaxial-wafer fabricating process for forming an epitaxial layer on the surface of a silicon wafer under a atmospheric pressure, the process comprising:

an annealing step for annealing the silicon wafer at a first temperature for a preset period of time;

an epitaxial growth step for forming an epitaxial layer on the silicon wafer by maintaining the silicon wafer at a second temperature and introducing a source gas to the silicon wafer; and the second temperature being lower than the first temperature.

Even when the epitaxial growth process is carried out at low temperature, the second epitaxial-wafer fabricating process can produce an epitaxial layer of good film quality if the anneal temperature is set at a sufficiently high temperature. The execution of the epitaxial growth process leads to reduction of the haze level.

In the second epitaxial-wafer fabricating process, the annealing process may be performed within an epitaxial growing furnace.

Therefore, the annealing step and the epitaxial growing step may successively be executed by merely switching the chamber-charging gas from a first gas to a second gas.

Also in the second epitaxial-wafer fabricating process, in the annealing process, the silicon wafer is heated in a hydrogen atmosphere.

Therefore, the wafer surface is cleaned in the hydrogen atmosphere, and an epitaxial layer may be formed on the wafer surface. The resultant epitaxial layer is good in quality.

In the second epitaxial-wafer fabricating process, upon completion of the annealing process, a source gas is fed into the epitaxial growth furnace to start the epitaxial growth process.

This technical feature reduces the high temperature process to a minimum. The annealing step and the epitaxial growing step may successively be executed by merely switching the chamber-charging gas from a first gas to a second gas. The epitaxial-wafer fabricating process of the invention provides an easy control of the epitaxial growth process and produces reliable epitaxial wafers.

Further, the second temperature may be equal to the first temperature in the second epitaxial-wafer fabricating process. Therefore, the silicon wafer undergoes little variation of temperature, and hence suffers from little thermal stress. This results in producing epitaxial wafers of good film quality and high reliability.

Additionally, the first and second temperatures may be each within a range from 950° C. to 1050° C. in the second epitaxial-wafer fabricating process.

Such a temperature range is used for both the annealing and epitaxial growing steps. This leads to haze-level reduction, and hence production of epitaxial wafers of good film quality and high reliability.

In the second epitaxial-wafer fabricating process, the first and second temperatures may be each within a range from 950° C. to 1050° C., and the source gas is a gas containing trichlorosilane and hydrogen.

Further, in the second epitaxial-wafer fabricating process, the first and second temperatures may be each within a range from 900° C. to 1000° C., and the source gas is a gas containing dichlorosilane and hydrogen.

Furthermore, in the second epitaxial-wafer fabricating process, the first and second temperatures are each within a range from 850° C. to 940° C., and the source gas is a mixture of a monosilane gas and a hydrogen gas.

According to yet another aspect of the invention, there is provided an epitaxial-wafer fabricating method comprising the steps of:

loading a silicon wafer into an epitaxial growth furnace;

an annealing process for heating the loaded silicon wafer placed within the epitaxial growth furnace in which a non-oxidizing atmosphere is set up, to a temperature corresponding to an epitaxial growth temperature and continuing the heating of the silicon wafer for a fixed period of time; and an epitaxial growth process for forming an epitaxial layer on the silicon wafer by introducing a source gas, at a predetermined flow ratio, into the epitaxial growth furnace in a state that the epitaxial growth furnace is maintained at a fixed temperature.

With this technical feature, the annealing step and the epitaxial growing step may successively be executed by merely switching the chamber-charging gas from a first gas to a second gas. The epitaxial-wafer fabricating method produces epitaxial layers of good film quality and suffering from less haze in a very easy manner. Further, no waiting time is present when the annealing process is switched to the epitaxial growth process. Time of heating the silicon wafer is reduced to a minimum. The epitaxial growth process may be performed under a fine control.

BRIEF DESCRIPTION OF THE DRAWINGS

Other objects, features and advantages of the invention will be apparent when carefully reading the following description in connection with the accompanying drawings, in which.

DESCRIPTION OF THE PREFERRED EMBODIMENTS

The preferred embodiments of a process of fabricating epitaxial wafers according to the present invention will be described with reference to the accompanying drawings.

Figure 1:
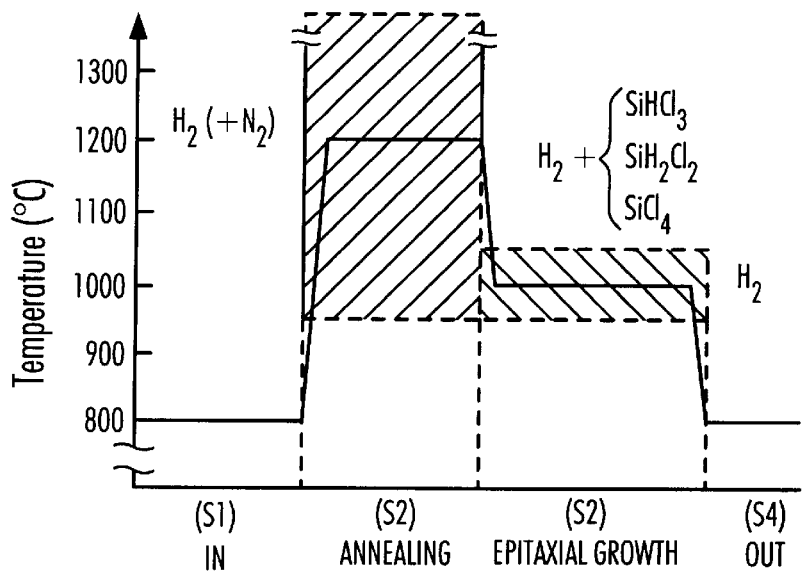
FIG. 1 is a graph useful in explaining a process for fabricating epitaxial wafers which is a first embodiment of the present invention.

FIG. 1 is a graph useful in explaining a process of fabricating epitaxial wafers which is a first embodiment of the present invention. In the graph, the ordinate represents temperature within a reaction furnace, and the abscissa represents a time-sequential flow of process steps in the epitaxial-wafer fabricating process, which is performed by the epitaxial-wafer fabricating process of the invention. In the figure, a character "S" followed by a number indicates a process step in the epitaxial growth process. In a process step S1, a silicon wafer surface polished is loaded into a reaction furnace. At this time, the reaction furnace has been filled with a hydrogen gas (anneal gas) and maintained at a atmospheric pressure and at about 800° C. When the silicon wafer is loaded into the reaction furnace, a nitrogen (N2) gas is inevitably entered from a preceding chamber into the reaction furnace. To cope with this, a hydrogen gas is injected into the reaction furnace for a predetermined period of time to purge the nitrogen gas out of the reaction furnace and to increase a degree of purity of the hydrogen.

In a process step S2, the inside of the reaction furnace is maintained at a given anneal temperature for a fixed period of time, whereby an annealing process is performed. The anneal temperature is set within a range from 950° C. to the melting point of the silicon wafer. In the process step S2, a range of the anneal temperature is shaded in the illustration, and an exemplar anneal temperature is 1200° C. (indicated by a solid line).

In a process step S3, a silane gas, such as a trichlorosilane ($SiHCl_3$,), dichlorosilane ($SiHCl_2$,) or tetrachlorosilane ($SidI_4$) gas, is injected into the reaction furnace till a predetermined partial pressure of the silane gas with respect to the hydrogen gas is reached. At this time, the hydrogen gas equal in volume to the silane gas is discharged out of the reaction furnace, so that the inside of the reaction furnace is maintained at a atmospheric pressure. Further, the reaction furnace is maintained at a growth temperature T, and the epitaxial growth process is performed. The growth temperature T is within a range from 950° C. to 1050° C. In the process step S3, a range of the growth temperature T is shaded in the illustration and the growth temperature T is set at 1000° C. and indicated by a solid line.

When the epitaxial growth terminates, temperature of the reaction furnace is decreased, and in the process step S4, an epitaxial wafer thus formed is unloaded out of the reaction furnace.

It is noted that the growth temperature T of the epitaxial wafer is set within the range from 950° C. to 1050° C. With this feature, a haze level on the surface of the epitaxial wafer is put within a region of the minimum values as will be described later. Therefore, the epitaxial wafer formed by the epitaxial-wafer fabricating process mentioned above is good in flatness and hence in product quality.

Epitaxial wafers were actually fabricated by use of the epitaxial-wafer fabricating process of the invention, and haze levels on the fabricated epitaxial wafers were measured.

The fabrication conditions were:
reactive gas pressure
within a reaction furnace—atmospheric pressure
annealing temperature—1200° C.
reactive gas: hydrogen+trichlorosilane ($SiHCl_3$)
((partial pressure ratio:$SiHCl_3:H_2$=1:370))
epitaxial wafer—crystal orientation <100>,
0°±1° (inclination angle)

The growth temperature T was varied to six temperature points; T1 (900° C.), T2 (950° C.), T3 (100° C.), T4 (1050° C.), T5 (1100° C.), and T6 (1130° C.). It was observed that an epitaxial wafer grown a t temperature T1 was partly monocrystallized; a perfect monocryistalline silicon wafer could not be formed. Therefore, a total of fifteen epitaxial wafers of t1 (=1 micron), t2 (2 microns) and t3 (=4 microns) thick were formed at the remaining temperature points T2 to T6.

Figure 2:
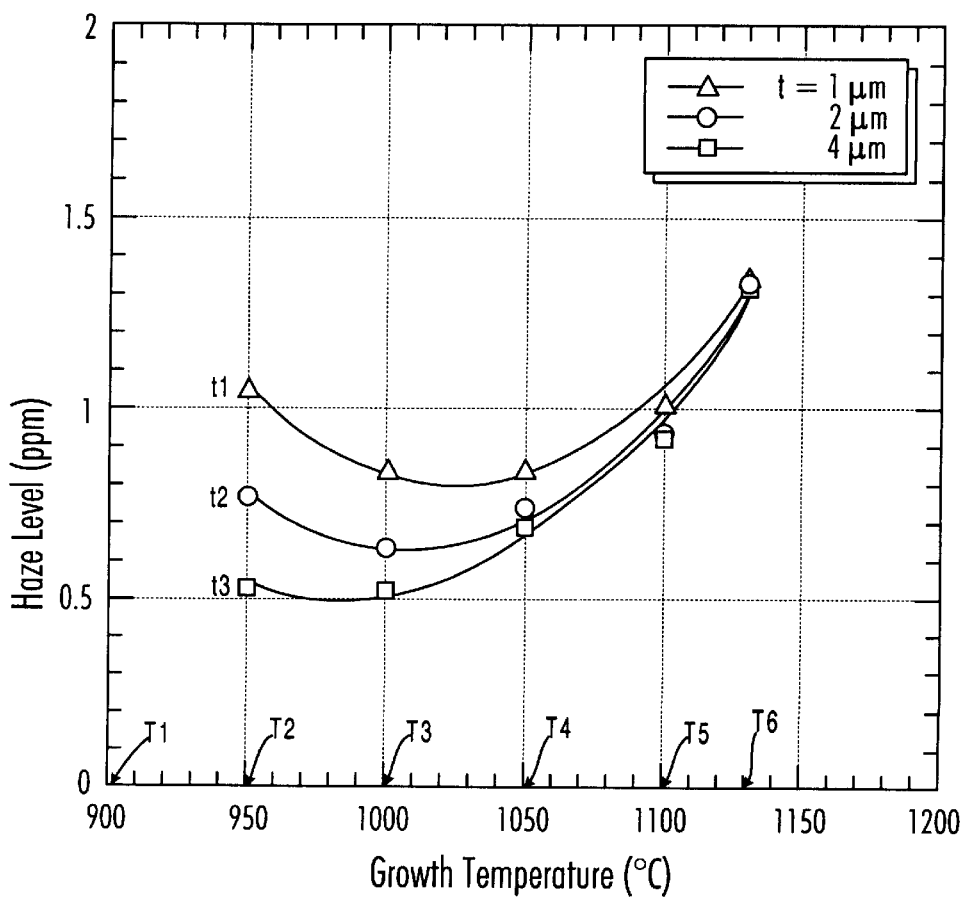
FIG. 2 is a graph showing a variation of haze level with respect to growth temperature.

A variation of haze level with respect to growth temperature is graphically depicted in FIG. 2. In a graph of FIG. 2, the ordinate represents haze levels and the abscissa represents growth temperature T. The haze level is evaluated, by use of a particle counter, in terms of a ratio of an intensity oflaser light projected onto the epitaxial wafer to an intensity of scattered laser light from the wafer surface which was sensed by a given sensor. The particle counter used was SFS (surf scan6220), manufactured by KLA Tencor corporation. As seen from FIG. 2, the haze-level variation curves t1 to t3 have their minimum values in a temperature region ranging from 950° C. (T1) to 1050° C. (T4). The graph teaches that in the atmospheric-pressure epitaxial growth process, the haze on the epitaxial wafer can be reduced if the growth temperature T is set in this temperature region. The graph also shows that the thicker the epitaxial wafer is, the lower the haze level is.

The surface of the epitaxial wafer of t3 (=4 microns) thick was coated with standard size particles (PSL;Poly styrene latex) of 87 nm in diameter, was measured by use of a particle counter. The particle counter was SPI (trade name) manufactured by KAL Tencor corporation. The results of the measurement were plotted on a graph of FIG. 3. The ordinate of the graph represents the numbers of particles counted by the particle counter, and the abscissa represents the diameters of the particles. The numbers of particles were measured at the growth temperatures T2 to T6. As shown, two peaks P1 and P2 appear in each of the curves representative of variations of the numbers of particles (output from the particle counter). The peak P1 arises from the 87 nm-diameter particles since the coating of the 87 nm-diameter particles is layered on the surface of the epitaxial wafer. It is estimated that the peak P2 present at other particle diameters-will arise from the haze. The particle counter considers the haze to be a particle of a virtual particle diameter (=conversion particle diameter D), and counts a level of the haze.

The guaranteeing of the product quality of the epitaxial wafer, as already described, is based on such a technical requirement as to reduce the number of particles of which the particle diameter is 100 nm or smaller to a predetermined number of particles or smaller. The present particle counter is incapable of measuring the particles of shorter than 80 nm in diameter. The method of guaranteeing the product quality of the epitaxial wafer, currently employed, is to count the number of particles of which the diameters are within 80 nm to 100 nm by use of the particle counter, and to present the count value as a value indicating the product quality of the epitaxial wafer. As the conversion particle diameter D is higher, it is more difficult to discriminate between the true particle peak P1 and the haze peak P2, and the measurement of the number of particles of small particle diameters is impossible.

Figure 3:
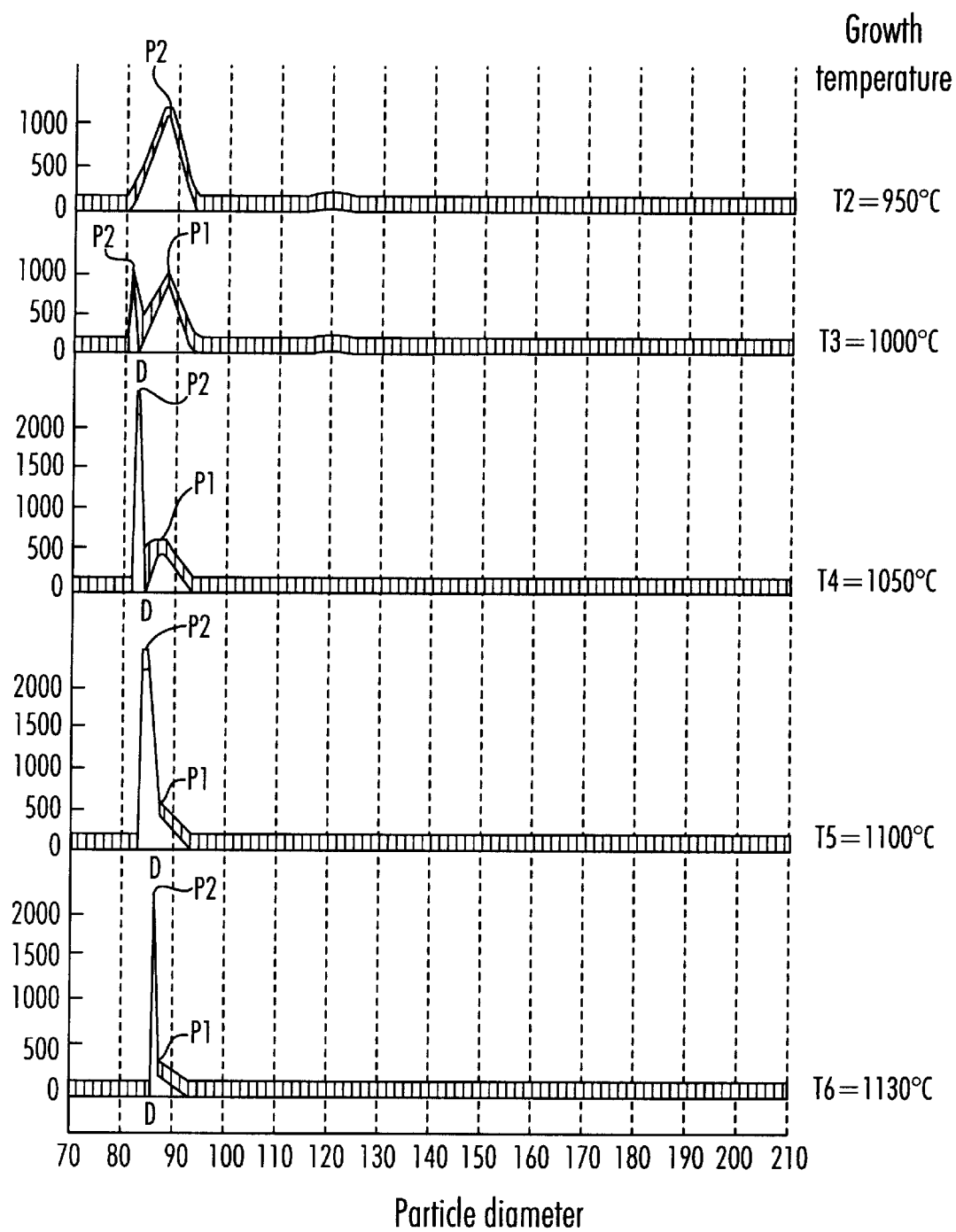
FIG. 3 is a graph showing a relationship between the numbers of particles and particle diameters.

An example of this will be described by comparing the measurement result at T5 (=1100° C., growth temperature) with that at T2 (=950° C.). In the case of T5, the conversion particle diameter D is about 83 nm as shown in FIG. 3. Therefore, it is impossible to discriminate between the peak P1 caused by the coating particle of 87 nm in diameter, and the peak P2 by the haze. The particle counter cannot measure true particles of which the particle diameters are shorter than 97 nm. The particle diameters of the product-quality guaranteeing particles are within a range of 87 nm to 100 nm. In the case of T2 (low temperature), the conversion particle diameter D is small, 80 nm or smaller. Therefore, the particle diameters of the product-quality quanranteeing particles are within a range of 80 nm to 100 nm. In this case, the particle counter counts the number of particles of 80 nm to 100 nm in diameter on an epitaxial wafer grown in an epitaxial growth furnace, and presents a count value for guaranteeing the product quality of the epitaxial wafer.

Thus, the lowering of the growth temperature T enables the particle counter to measure particles of small diameters (size). Therefore, where the growth temperature T is low, the number of particles measured by the particle counter is increased. An accuracy of the measurement by the particle counter is improved, and the product quality of the epitaxial wafer is more precisely evaluated. In the case of the epitaxial wafer having the crystal orientation <100> and the inclination angle 0°±1°, its haze has the minimum value in the growth-temperature range from 950° C. to 1050° C. under a atmospheric pressure, as seen from FIG. 2. If the growth temperature is selected to be within such a temperature range, the haze level takes the minimum value. Where the haze level is low, the measuring accuracy of the particle counter is improved. In other word, the particle counter can accurately measure the number of particles,on the fabricated epitaxial wafer. Therefore, a degree of contamination of an epitaxial growth furnace, which is used for epitaxially forming epitaxial wafers as products, can be evaluated in a manner that an epitaxial layer used for evaluation is formed under those conditions by use of the furnace, and only the number of particles on the epitaxial layer is measured by the particle counter in a state that the haze level is reduced. The number of particles on the evaluation epitaxial layer, thus measured, may be used for evaluating a degree of clarity in the epitaxial growth process and hence, the epitaxial wafers manufactured by use of the epitaxial growth furnace. The result is to guarantee the measurement of the numbers of particles on the epitaxial wafers manufactured in the epitaxial growth furnace and hence, the product quality of the wafers.

As seen from the foregoing description, to epitaxially grow a monocrystalline layer with less haze and of good quality in the low- temperature epitaxial growth process, the following conditions need to be satisfied:

1) The epitaxial layer is not polycrystallized.
2) The haze level is small.
3) The conversion particle diameter D is low.

The condition 1) may be satisfied when the growth temperature T is set at 950° C. or higher. The condition 1) is satisfied when the growth temperature T may be set in the range from 950° C. to 1050° C. The condition 3) may be satisfied by reducing the conversion particle diameter D. Epitaxial wafers of good quality can be produced when those conditions are properly satisfied.

Thus, in the embodiment of the invention, epitaxial wafers at low haze level and of good quality can be produced when 1) the low-temperature epitaxial growth process is employed for the epitaxial growth process, and 2) the growth temperature T is set at value of temperature lower than the normal growth temperature by 50 to 100° C. Further, the wafer fabricating process reduces the conversion particle diameter D. Therefore, the particle counter can measure the number of particles of the small particle diameters, and the measure is accurate. Therefore, the wafer fabricating process reliably guarantees the product quality of the fabricated epitaxial wafers.

A growth of an epitaxial wafer when the anneal temperature is varied will be described hereunder.

To explain, a test was conducted. In the test, a silicon wafer was subjected to annealing process at anneal temperatures 900° C., 950° C. and 1200° C. Epitaxial growth process was performed at growth temperature T of 900° C. and 950° C. The results of the test are shown in Table 2.

TABLE 2

|  | Growth Temperature | |
| --- | --- | --- |
| Annealing Temperature | 900° C. | 950° C. |
| 900° C. | x | x |
| 950° C. | x | o |
| 1200° C. | x | o |

As seen from the table, a monocrystalline silicon layer could be grown when the anneal temperature was 950° C. and 1200° C., and the growth temperature T was 950° C. A part of the epitaxial layer was polycrystallized, viz., the epitaxial growing process went not well, when the anneal temperature was 900° C. and 950° C., and the growth temperature T was 900° C. From the above, it is seen that the anneal temperature is preferably set within a range from 950° C. to the melting point or smaller of the silicon wafer.

In the embodiment, the anneal gas is a hydrogen gas, and the reactive gas (used in the epitaxial growth stage) is a trichlorosilane gas. Any kinds of gases available for the atmosphereic-pressure epitaxial growth process may be used for the anneal gas and the reactive gas, however.

Generally, the silicon wafer of <100 > in crystal orientation and 0°±1° in an inclination angle tends to have a high haze level. The inventor(s) found the fact that even if this type of silicon wafer is used, its haze level is minimized within a specific range of the growth temperature in the epitaxial growth process. The present invention uses such a specific temperature range is used in the epitaxial growth process, and hence succeeds in reducing the haze level on the semiconductor wafer. The invention is very effective in particular when it is applied to the manufacturing of that type of silicon wafers.

Figure 4:
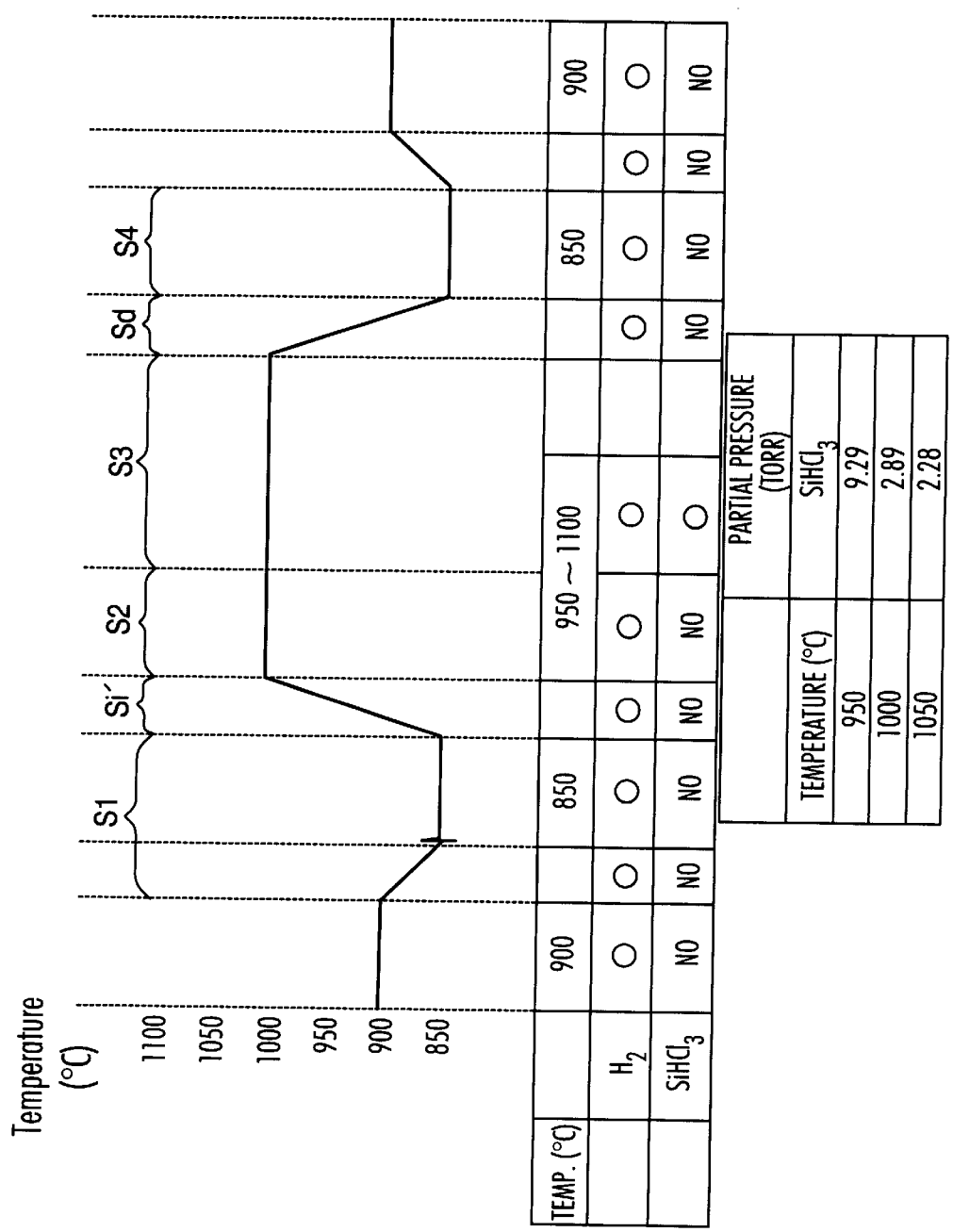
FIG. 4 is a graph useful in explaining a process for fabricating epitaxial wafers which is a second embodiment of the present invention.

A second embodiment of the present invention will be described with reference to FIG. 4. FIG. 4 is a diagram showing an epitaxial growth process, which is performed by another epitaxial-wafer fabricating process of the invention. In the figure, a character "S" followed by a number indicates a process step in the epitaxial-wafer fabricating process. In a process step S1, a silicon wafer surface polished is loaded into a reaction furnace. At this time, the reaction furnace has been filled with the hydrogen (anneal gas) and maintained at a atmospheric pressure and at about 800° C. When the silicon wafer is loaded into the reaction furnace, a nitrogen (N2) gas is inevitably entered from a preceding chamber into the reaction furnace. To cope with this, a hydrogen gas is injected into the reaction furnace for a predetermined period of time to purge the nitrogen gas out of the reaction furnace till the reaction furnace is filled with only the hydrogen gas.

Temperature within the chamber is increased up to 1000° C. of the anneal temperature (step S1). In the next step S2, the reaction furnace is maintained at this temperature (anneal temperature) for a predetermined period of time, and the silicon wafer is subjected to an annealing process for 45 to 220 seconds.

In a step S3, a trichlorosilane gas ($SiHCl_3$) is injected into the reaction furnace to form a mixture gas consisting of hydrogen and trichlorosilane (partial pressure of the trichlorosilane=1.24kPa). At this time, the hydrogen gas equal in volume to the silane gas is discharged out of the reaction furnace, so that the inside of the reaction furnace is maintained at a atmosphereicpressure. The reaction furnace is also maintained at a growth temperature T. Under this condition, the epitaxial growth process is performed.

When the epitaxial growth process terminates, the temperature in the reaction furnace is decreased (step Sd). Epitaxial wafers thus are unloaded from the reaction furnace (step S4).

Thus, in the epitaxial growth process performed by the epitaxial-wafer fabricating process, the annealing step may be switched to the epitaxial growing step by merely switching the chamber-charging gas from a first gas to a second gas.

Upon completion of the annealing step, a source gas is fed into the epitaxial growth furnace to start the epitaxial growing step. With this feature, no waiting time is present and the high temperature process is reduced to a minimum. The annealing step and the epitaxial growing step may successively be executed by merely switching the chamber-charging gas from a first gas to a second gas. The epitaxial-wafer fabricating process of the invention provides an easy control of the epitaxial growth process and produces reliable epitaxial wafers.

Further, it is noted that temperature is kept constant in both the annealing and epitaxial growing steps. Because of this, the silicon wafer undergoes little variation of temperature, and hence suffers from little thermal stress. This results in producing epitaxial wafers of good film quality and high reliability.

The temperature is used for both the annealing and epitaxial growing steps. This leads to haze-level reduction, and hence production of epitaxial wafers of good film quality and high reliability.

While the anneal temperature and the growth temperature are both set at 1000° C. in the above-mentioned embodiment, those temperature may be set at any value of temperature within the range from 950° C. to 1050° C. because the haze level on the surface of the epitaxial wafer is minimized within this range. The epitaxial wafers fabricated under this temperature condition are good in flatness and film quality. When the source gas is changed from a first source gas to a second source gas, an optimum temperature also varies, and it is confirmed that the condition is within the following range.

What is claimed is:

1. An epitaxial-wafer fabricating process for epitaxially growing a silicon layer on the surface of a silicon wafer having a crystal orientation <100> or <111> and an inclination angle of 0°±1° in a reactive gas at an atmosphere pressure, wherein a growth temperature T is lower than a normal growth temperature by 50° C. to 100° C. during the epitaxial growth process.

2. An epitaxial-wafer fabricating process according to claim 1, wherein an annealing process is performed at a temperature within a range from 950° C. to a melting point of silicon before said epitaxial growth process.

3. An epitaxial-wafer fabricating process for forming an epitaxial layer on the surface of a silicon wafer under an atmospheric pressure, said process comprising:

an annealing step for annealing said silicon wafer at a first temperature for a preset period of time;

an epitaxial growth step for forming an epitaxial layer on said silicon wafer by maintaining said silicon wafer at a second temperature and introducing a source gas to said silicon wafer; and said second temperature being lower than said first temperature.

4. An epitaxial-wafer fabricating process according to claim 3, wherein said annealing step is performed within an epitaxial growing furnace.

5. An epitaxial-wafer fabricating process according to claim 4, wherein in said annealing step, said silicon wafer is heated in a hydrogen atmosphere.

6. An epitaxial-wafer fabricating process according to claim 5, wherein upon completion of the annealing step, a source gas is fed into said epitaxial growth furnace to start said epitaxial growth process.

7. An epitaxial-wafer fabricating process according to claim 6, where said second temperature is equal to said first temperature.

8. An epitaxial-wafer fabricating process according to claim 7, wherein said first and second temperatures are each within a range from 950° C. to 1050° C.

9. An epitaxial-wafer fabricating process according to claim 7, wherein said first and second temperatures are each within a range from 950° C. to 1050° C., and said source gas is a mixed gas containing trichlorosilane and hydrogen.

10. An epitaxial-wafer fabricating process according to claim 7, wherein said first and second temperatures are each within a range from 900° C. to 1000° C., and said source gas is a gas containing dichlorosilane and hydrogen.

11. An epitaxial-wafer fabricating process according to claim 7, wherein said first and second temperatures are each within a range from 850° C. to 940° C., and said source gas is a gas containing monosilane and hydrogen.

12. An epitaxial-wafer fabricating method comprising the steps of:

loading a silicon wafer into an epitaxial growth furnace;

an annealing process for heating said loaded silicon wafer placed within said epitaxial growth furnace in which a non-oxidizing atmosphere is set up, to a temperature corresponding to an epitaxial growth temperature and continuing the heating of said silicon wafer for a fixed period of time; and an epitaxial growth process for forming an epitaxial layer on said silicon wafer by introducing a source gas into said epitaxial growth furnace in a state epitaxial growth furnace is maintained at a fixed temperature.

* * * * *